United States Patent [19]

Chase

[11] Patent Number: 5,189,368
[45] Date of Patent: Feb. 23, 1993

[54] MAGNETOMETER
[75] Inventor: Walter E. Chase, Dover, N.H.
[73] Assignee: Lockheed Sanders, Inc., Nashua, N.H.
[21] Appl. No.: 726,367
[22] Filed: Sep. 24, 1976
[51] Int. Cl.[5] .............................................. G01V 3/00
[52] U.S. Cl. .................................. 324/304; 324/301; 102/417
[58] Field of Search ............. 340/4; 324/0.5 E, 0.5 F, 324/0.5 R, 304, 301; 102/417

[56] References Cited

U.S. PATENT DOCUMENTS

| | | | |
|---|---|---|---|
| 3,129,410 | 4/1964 | Sorokin | 324/0.5 F |
| 3,500,176 | 3/1970 | Kastler et al. | 324/0.5 F |
| 3,526,002 | 8/1970 | Waddel | 340/4 R |
| 3,750,008 | 7/1973 | Asano | 324/0.5 F |

OTHER PUBLICATIONS

Monitor Developed for Nitric Oxide Pollution, Nat. Bur. of Stand. Tech. News Bull. (U.S.A.) vol. 56, No. 9, Sep. 1972, p. 221.

Primary Examiner—Theodore M. Blum
Attorney, Agent, or Firm—Robert K. Tendler; David W. Gomes

[57] ABSTRACT

A magnetometer is desclosed in which a gas cell containing atomic vapor is pulse pumped at one of the transitions of the gas in the cell. After the pulse has passed through the gas cell, thereby causing alignment of all the individual atomic moments along the propagation direction of the pulse, a probe beam reads out the Larmor precession frequency of the freely precessing atoms in terms of the frequency of the amplitude modulation of the probe beam caused by the free precession within the gas cell. The system is suitable for laboratory measurements of the absolute value of a magnetic field and for packaging in an expendable battery powered water-born buoy becuase of the low power consumption of the subject system.

32 Claims, 4 Drawing Sheets

MAGNETOMETER

FIELD OF THE INVENTION

This invention relates to magnetometers and more particularly to a pulse pumped and/or free precession magnetometer in which the magnetic field is measured in terms of the Larmor precession frequency of the freely precessing atoms whose angular moments have been aligned by the passage of a pulse of pumping energy through a gas cell containing an atomic vapor.

BACKGROUND OF THE INVENTION

The subject invention relates to improvements in the measurement of magnetic fields in terms of providing a new laboratory instrument and also in terms of providing a new magnetometer for antisubmarine warefare (ASW) applications in which individual magnetometers are carried by air-dropped or moored water-born buoys, which are distributed over a given area to monitor either subsurface or surface activity.

It is well known that submarines and surface ships alter the local magnetic fields in the vicinity of the ship. In prior art ASW surveillance systems, a so-called "point" magnetometer is carrie don a boom mounted aft of an aircraft and the aircraft executes a search pattern in search of changes of the local magnetic field which would indicate the presence of a submarine or a surface ship. It will be appreciated that in this mode of operation only one point immediately below the point magnetometer is searched at a time and that a submarine or surface ship may avoid detection simply by not being at the point searched at the time that the magnetometer is overflying the point.

Up to the present time, it has been inexpedient to provide water-born buoys with magnetometers due to a number of factors. The first factor which is almost determinative of the situation is the power drain when utilizing present day "point" magnetometers. The usual point magnetometer is the so called nuclear magnetic resonance (NMR) spectrometer or optically pumped magnetometer which involves the use of a continuous pumping beam and the use of an RF feedback for stimulating the natural precession of the magnetic moments or magnetic angular momentum vectors of atoms in a gas cell about a local magnetic field. The use of a continuous pumping beam of sufficient magnitude to stimulate the gas would run down currently available batteries utilized in water-born buoys in a matter of minutes, thereby precluding the use of this type of system in buoys whose life must be in excess of one hour.

Moreover, in nuclear magnetic resonance spectrometers there is a problem with the intensity stability of the source. It is well known that the presence of a continuous pumping beam actually shifts the atomic precession frequency away from the value which it would have had in the absence of this beam. Fluctuations in pumping light intensity translate into fluctuations in atomic precession frequency, which fluctuations are indistinguishable from those caused by changes in magnetic field strength. Great sensitivity in such a magnetometer therefore requires an extremely stable light source, and the construction of a light source of this type is quite costly. Moreover, the maintenance of a stable light source in a buoy environment is all but impossible.

An additional power draining feature in prior art systems is the feature which requires the generation of a periodic magnetic field in the RF region of the electromagnetic spectrum to stimulate the Larmor precession. Not only does this additional source draw energy from the battery continuously, but the RF field also affects the measurement in the same manner as the continuous pumping beam by engendering shifts in the atomic resonance frequency (Bloch-Siegert Shift). It will be appreciated that most previous optically pumped magnetometers have required the presence of the RF magnetic field to drive the atomic precession and thus render it susceptible to observation.

Moreover, the alignment of the RF field with the pumping beam axis is extremely critical. It will be appreciated that the maintenance of this alignment in a buoy application is difficult due to the shock experienced when the buoy hits the water.

While the above problems exist specifically with respect to the water-born buoy application mentioned above, laboratory instruments involving the use of NMR spectrometers also suffer from the effect of the continuous pumping beam on frequency and the effect of the RF field on the measurement being made.

The above problems are solved by the subject invention in which, in one embodiment, a circularly polarized "pulse" of light from a high intensity source such as a laser is projected through a gas cell, with the wavelength of the light corresponding to a predetermined transition of the gas. A relatively weak continuous probe beam at this transition is projected through the gas cell in a direction normal to the direction of propagation of the "pulse". After the passage of the pulse through the cell, due to the high intensity of the pulse the angular moments of large numbers of atoms line up in the direction of the propagation of the "pulse" and thereafter freely precess about the local magnetic field at the Larmor frequency. The free precession frequency, which is proportional to the local magnetic field, is then read out in terms of the frequency of the amplitude modulation of the probe beam caused by the rapid periodic population shifts between weakly and strongly absorbing magnetic sublevels of the atoms in the gas as the atoms precess.

The purpose of the pumping source is to pump up large numbers of atoms in the gas cell. Because of the high degree of polarization which can be obtained by a single pulse of the laser, free precession can be observed for a relatively long period of time before the signal has decayed to an unobserved level. Thus, no reinforcement of the free precession is necessary.

Once pumping is accomplished, pumping energy is no longer needed and is, in fact, undesirable. By using a pulse of pumping energy, instead of continuous illumination, the effect of the pumping beam on the measurement is eliminated because once the pulse exits the cell, it has no effect on the gas in the cell.

While it is true that the presence of the probe beam will tend to shift the atomic precession frequency, this beam is much less intense than the beam used for pumping and its effect is correspondingly reduced and made quite negligible. It will be appreciated that the gas utilized is desirably one which has a zero orbital angular momentum state (S state), containing one or several unpaired electrons. Alternatively, other states having unpaired electrons may be utilized.

The S state is desirable because of its zero orbital angular momentum, which relaxes or decays at a slower rate than do states having non-zero orbital angular momenta. It is a finding of this invention that the decay is sufficiently slow to permit observation of the free precession which is measured by the subject system.

The magnitude of the magnetic field at the gas cell is determined from the frequency of the amplitude modulation of the probe beam. The probe beam is modulated at the frequency, ω, of the precessing atoms in the gas by a process involving population shifts between weakly and strongly absorbing angular momentum sublevels after pumping has occurred. As is generally understood, the periodic population shift takes place at the same frequency as that of the precession. In this case, "free precession" refers to the absence of any external reinforcement of the natural precession either by feedback loops or otherwise. It is a finding of this invention that when using a high energy pumping pulse no feedback or direct stimulus is necessary in order to read out the Larmor frequency of the freely precessing atoms. While absolute value of the magnetic field may be obtained from the subject apparatus, in ASW applications, changes in the magnetic field, $d\bar{H}dt$, representative of a passing ship or submarine may be detected without the detection of the absolute value of the magnetic field.

As will be appreciated, the obtaining of free precession without RF feedback eliminates the need for a direct coupled alternating magnetic field, the power associated with the generation of the field and the frequency shift engendered by the use of such a field, as well as the problem of aligning the RF field coils.

Secondly, by the use of a pulsed source, the effect of the source on the measurement is completely eliminated as well as reducing the power requirements by eliminating the need for a continuous beam. The source is pulsed at a rate which, in general, will be much longer than the rate of Larmor precession for the particular gas and the expected magnetic field. In water-born buoy operation to conserve power the source may be pulsed at a rate as low as 5 times a second. Finally, the requirement for a stable source is eliminated because the pumping beam has no effect on the observed resonance frequency.

The subject system has unique application to water-born buoys outfitted with the subject magnetometer because of the low power drain and the relatively limited effect of the marine environment on this type of magnetometer. It will be appreciated that for ASW applications it is only the change in magnetic field due to the passage of a ship or submarine, as opposed to the absolute value of the magnetic field, which need be monitored. The motion of the buoy due to wave action or currents can be designed to be outside of the change in magnetic field value expected due to the passage of surface or surface vessels, even though the motion of the buoy would have an effect on measurement of the absolute value of earth's magnetic field at the buoy.

As a laboratory instrument, the subject magnetometer is easily controlled with stability and alignment being considerably less critical than in the prior art optically pumped magnetometers. Moreover, the pumping source may be a low power semiconductor laser or a multimode laser which emits a relatively broad spectrum of radiation, one peak of which will be at the appropriate transition of the atoms in the gas.

While most optically pumped magnetometers have utilized RF feedback at the Larmor frequency, as illustrated in U.S. Pat. No. 3,173,082 issued to W. E. Bell et al on Mar. 9, 1965, one embodiment of a magnetometer is described in the Bell et al patent in which a directly-coupled alternating magnetic field is not used. In Bell et al, embodiment of FIG. 1 a continuous source is modulated at ω=Larmor precession frequency to "reinforce" the natural precession and the field is read out as the absolute amplitude of the pumping beam rather than ω.

In this embodiment of the Bell et al system, there is no free precession because the modulation of the pumping beam "reinforces" the precession. Moreover, there is no pulsed source, as in the subject system. The Bell et al source is continuous, and interaction with the gas is required, while in the subject system, care is taken to prevent interaction of the pumping beam and the gas once the precession phenomenon has been initiated as a result of the pumping.

Moreover, Bell et al do not use a separate probe beam and do not measure "modulation" of this probe beam. Bell et al do measure the modulation of the pumping beam (see FIGS. 5-7). However, in the embodiments of FIGS. 5-7 regenerative feedback is employed.

Thus, unlike the Bell et al system, the subject system is pulse pumped and does not depend on reinforced or stimulated precession in order to detect the atomic resonance precession frequency.

It is therefore an object of this invention to provide an improved magnetometer utilizing pulse pumping.

It is a further object of this invention to provide a magnetometer in which free precession is allowed to exist and from which a measurement of the local magnetic field is made.

It is another object of this invention to provide a magnetometer suitable for use in ASW applications either from moored buoys or from expendable air-dropped buoys in which power drain and stability requirements are minimized.

It is another object of this invention to provide an improved ASW system utilizing a pulsed pumped magnetometer.

It is still further object of this invention to provide an improved ASW system utilizing a magnetometer operating on the principle of free precession.

It is a still further object of this invention to provide a low cost, easily fabricated magnetometer.

These and other objects will be better understood in conjunction with the following specification taken in conjunction with the drawings in which:

DETAILED DESCRIPTION

Figure 1:
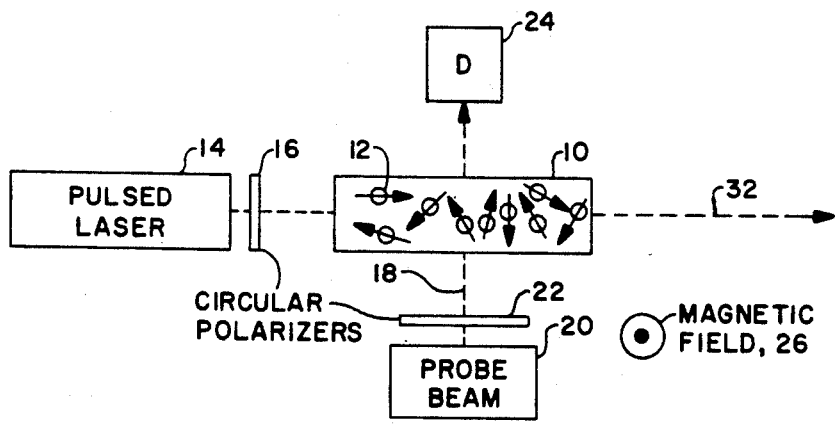
FIG. 1 is a block diagram of the subject invention illustrating the random orientation of the atoms in the gas cell prior to laser pumping.

Referring now to FIG. 1, a gas cell 10 is provided with a gas, with the atoms 12 of the gas exhibiting randomly oriented angular momentum vectors as illustrated. The gas, in one of the most efficient embodiments, is one in which there are unpaired electrons in an S ground state. Gases suitable for use in the subject magnetometer include, but are not limited to, vapors of the alkaline metals and metastable hydrogen. For purposes of the subject invention, the term gas will also include atomic vapor, and, in a preferred embodiment, cesium is utilized.

Gas cell 10 is illuminated by a high energy pulsed source, most conveniently a laser, here illustrated by reference character 14. The laser projects its pulsed energy through a circular polarizer 16 and thence through the gas cell. It will be appreciated that the gas cell is transparent to the radiation from the pulsed laser. The wavelength of the laser is set to a transition of the gas, commonly the $S_{-\frac{1}{2}} \rightarrow P_{-\frac{1}{2}}$ transition of the gas. In cesium this is the 8944 Å transition.

In the embodiment of FIG. 1 a probe beam 18 from a source 20 propagates through a circular polarizer 22, through gas cell 10 and impinges on to a detector 24. Source 20 is also set to the $S_{-\frac{1}{2}}{}^{43} P_{-\frac{1}{2}}$ transition in one embodiment. This source may be continuous and at a relatively low level, such as $10^{-4}$ watts, and in one embodiment may be a light emitting diode source. The detector may be any one of a number of detectors which respond to the wavelength of the probe beam, such as a phototube or photodiode detector. As can be seen, the local magnetic field direction is indicated at 26 to be coming out of the plane of the paper, although the orientation of the magnetic field with respect to the magnetometer is not particularly critical.

In fact, the probe beam can be made colinear with the direction 32 of propagation of the energy from the pulsed laser. Although the direction of the local magnetic field is not particularly critical, there will be some orientations of the magnetic field which may result in very little if any precession. This is the case when the direction of the magnetic field is colinear with the propagation direction of the energy from the pulsed laser.

Prior to the production of a pulse from laser 14 each of the atoms in the gas is free to precess about the local magnetic field vector. However, due to the random initial orientation of the atoms, a large variety of differently oriented precessions will exist. On the average, these precessions will cancel out and no meaningful measurement of the local magnetic field strength can be made.

Figure 2:
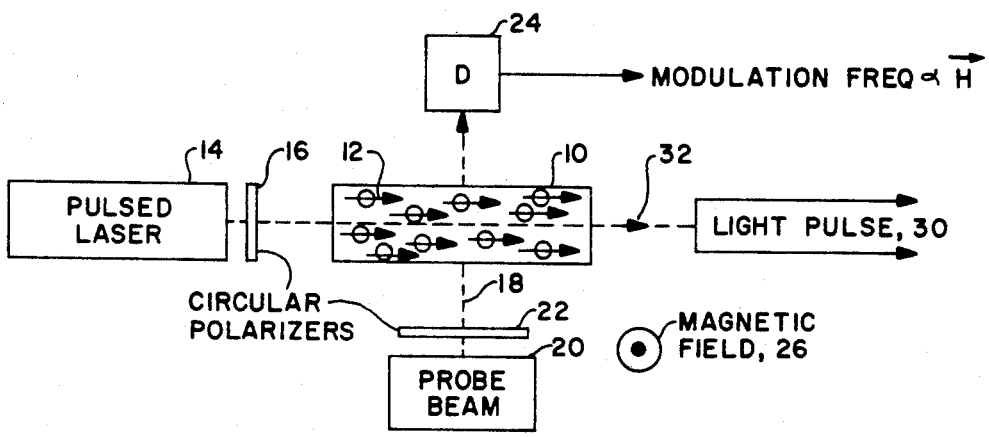
FIG. 2 is a block diagram of the subject invention illustrating the alignment of the atomic moments of the atoms in the gas cell subsequent to pumping by a light pulse from a laser.

The situation is considerably different after a high energy pulse of light, generally illustrated at 30 in FIG. 2, has passed through the gas cell 10. After the passage of light pulse 30, all of the atomic moments of the atoms in the gas cell will be lined up along the direction of propagation of the circularly polarized pulse.

The number of atoms pumped depends on the intensity of the pulsed source, and thus, the degree of polarization which can be obtained by a single pulse of the laser is also determined by the amplitude of the light pulse. It is the finding of this invention that currently available light emitting diode (LED) type lasers produce a sufficient amount of energy per pulse to produce 90% polarization in cesium vapor confined in a cubical optical pumping cell 4 cm. on a side. Currently available LED type lasers typically have an output of $10^{-4}$ joules per pulse which is clearly adequate for the pumping. Moreover, pulse repetition rates of 10 to 100 Hz used by the subject system are easily obtained with these devices. In a typical embodiment, a pulsed repetition rate of 10 to 100 pulses per second is clearly satisfactory, since the delivery of pulses of $10^{-4}$ joules per pulse produces relatively long periods of time before the precession phenomenon has decayed to an unobservable level. Typically, in cesium the useable pumping lifetime for purposes of making a measurement is on the order of 1/10 to 1/100 sec.

Once the atoms are aligned in the above manner, their angular momentum vectors will precess around the local magnetic field vector at a rate, ω, which is proportional to the strength of the local magnetic field vector. As will be described, at the same time that the atoms are precessing freely about the local magnetic field vector, there will be population shifts between weakly absorbing sublevels and strongly absorbing sublevels at the precession frequency, commonly called the Larmor frequency. As a result of these population shifts the probe beam will first be more strongly absorbed then less strongly absorbed in a cyclic manner in accordance with the shifting populations between the sublevels. This, in effect, amplitude modulates the light beam at the Larmor frequency and the amplitude modulation thus imparted to the probe beam is detected at detector 24. Thereafter it is a simple matter to detect the modulation frequency of the output from the detector, with the modulation frequency being proportional to the strength of the local magnetic field. This phenomenon is qualitatively described in connection with FIGS. 3A and 3B and FIG. 4.

Figures 3A, 3B:
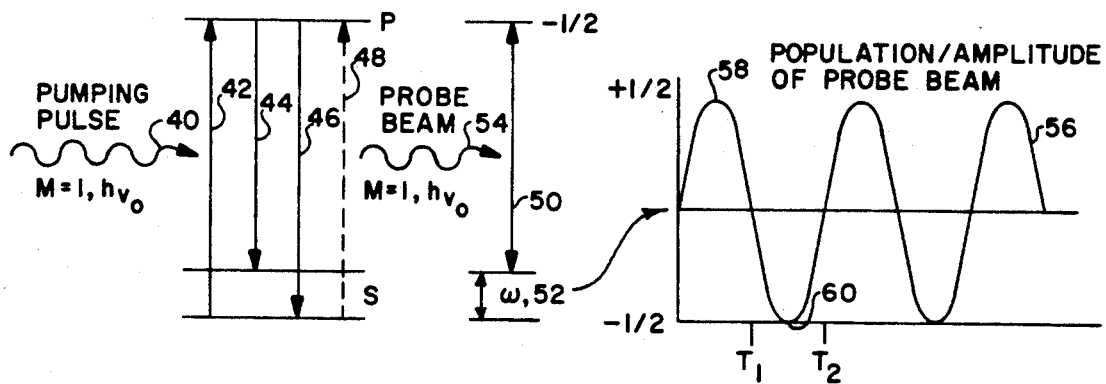
FIGS. 3A and 3B are energy level and population-/amplitude diagrams illustrating the pumping process and the process by which the probe beam is modulated.

Referring now to these figures, as can be seen from FIG. 3A which is an energy level diagram in its most simple form, a pumping pulse, as illustrated by arrow 40, having an angular momentum $M=1$ and a energy equal to $h\nu_o$ raises the energy of the electrons in an S level from the strongly absorbing $M=-\frac{1}{2}$ sublevel of the atom to a P transition level as illustrated by arrow 42. Thereafter, the atom decays as illustrated by arrows 44 and 46 to either the weakly absorbing $M=+\frac{1}{2}$ sublevel or the strongly absorbing $M=-\frac{1}{2}$ sublevel, thereby populating both sublevels. As to the weakly absorbing sublevel, the population remains fairly constant, but as to the strongly absorbing sublevel, electrons in this sublevel are again pumped up to the P level as illustrated by dotted arrow 48 from which point another decay occurs. What finally results is a heavily populated, weakly absorbing sublevel with virtually no atoms residing at the strongly absorbing sublevel.

Due to the interaction of the aligned angular momentum vectors with the local magnetic field, an exchange takes place between the weakly absorbing and the strongly absorbing sublevels at the Larmor frequency. What results is an absorption line such as that illustrated by arrow 50 whose magnitude varies at the Larmor precession rate, $\omega$, as illustrated by double ended arrow 52. When a probe beam 54 having an angular momentum M=1 and an energy equal to $h\nu_0$ passes through the gas cell, energy is absorbed from the probe beam as would be expected by the classical absorption process. However, the amount of energy absorbed in the probe beam varies in accordance with the population shift between the weakly absorbing and the strongly absorbing sublevels.

Referring to FIG. 3B, cyclic waveform 56 records both the shift in population between the sublevels and also the amplitude of the probe beam. It will be appreciated that when, as illustrated by peak 58, the majority of the population resides in the weakly absorbing sublevel, the amplitude of the probe beam is at a maximum, whereas at the valley indicated by reference character 60, the majority of the population resides in the strongly absorbing sublevel and therefore there is considerably more atenuation of the probe beam.

Figure 4:
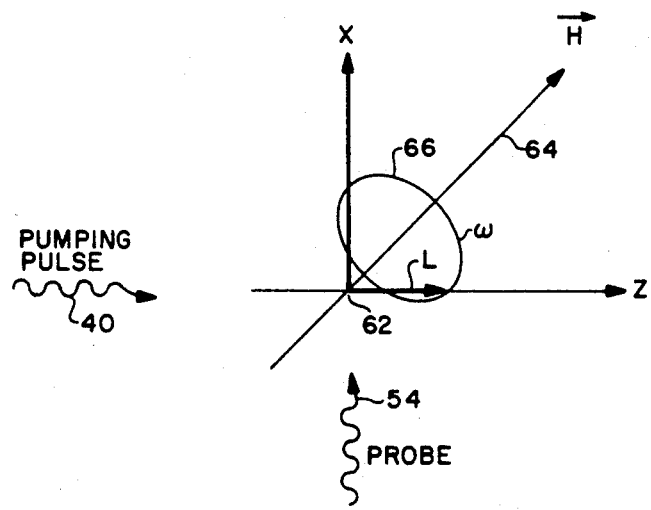
FIG. 4 is a diagram illustrating the relationship between the propagation direction, the direction of the local magnetic field and the direction of propagation of the probe beam, showing the precession of the angular momentum vector of an atom about the local magnetic field vector.

Referring to FIG. 4 the direction of the pumping pulse, conventionally lies along the Z axis. The angular momentum of an atom 62 along the Z axis after the pumping pulse has passed the atom is illustrated by vector L. The direction of the probe beam, for convenience, is along the X axis, with the direction of the local magnetic field vector being illustrated by vector 64.

Once the angular momentum vector of the atom is aligned along the Z axis by virtue of the pumping pulse it precesses about the local magnetic field vector as illustrated at 68 at a frequency, $\omega$, proportional to the strength of the magnetic field vector. With respect to the X axis it will be appreciated that the projected value of the angular momentum of the atom onto the X axis varies cyclically at a rate $\omega$. It will also be appreciated that the probe beam direction may, in fact, be any direction.

It will thus be appreciated that the orientation of the subject magnetometer relative to the magnetic field is not critical, and, in fact, it will only be the amplitude of the modulation which is affected by the relative geometry, not the frequency of the amplitude modulation. Thus, accurate magnetic field measurements can be made regardless of the orientation of the magnetometer, with the single exception that the direction of propagation of the pumping pulse should not be colinear with that of the local magnetic field vector.

The system described illustrates pumping from $S_{-\frac{1}{2}}$ to $P_{-\frac{1}{2}}$ and probing at this same frequency. It is, however, possible to pump from $S_{-\frac{1}{2}}$ to $P_{-\frac{1}{2}}$ and to probe at $S_{-\frac{1}{2}}$ to $X_{n/2}$ where n is any odd integer. This is because the population shift between the magnetic sublevels will cause modulation of the probe beams at transitions other than at the $S_{-\frac{1}{2}} \rightarrow P_{-\frac{1}{2}}$ transition. Thus, pumping and probing can take place at different frequencies to minimize any interference between the two frequencies at the detector. The detector can, of course, be set to respond only to the probe beam light.

Moreover, pumping and probing may take place between any of the allowed transitions as long as there are unpaired electrons (e.g. strongly and weakly absorbing sublevels) in the lower of the two states and the lower of the two states has a sufficiently long lifetime.

Figure 5:
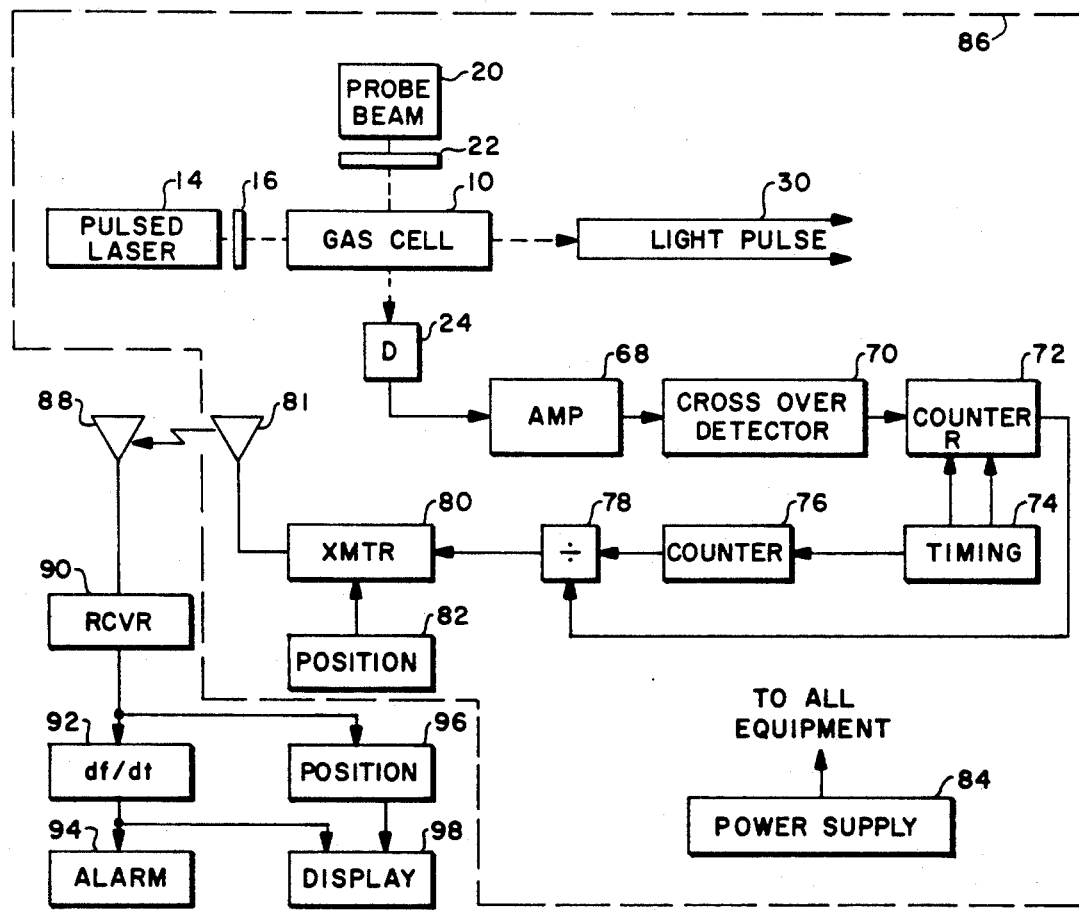
FIG. 5 is a schematic diagram illustrating one embodiment of the subject invention in which a water-born buoy is provided with the subject magnetometer and in which apparatus remote from the buoy is provided for the detection of signals from the buoy.

Referring now to FIG. 5, in one embodiment suitable for ASW applications, the magnetometer may consist of the aforementioned gas cell 10, pulsed laser 14, circular polarizers 16 and 22 and a continuous probe beam source 20, with detector 24 coupled to a conventional amplifier 68 which is in turn coupled to a conventional cross-over detector 70. The purpose of the cross-over detector is to detect the zero crossings of the amplitude modulated signal from amplifier 68. The output of the cross-over detector is applied to a conventional counter 72 which counts the number of zero cross-overs over a predetermined period of time. This counter is clocked and reset by a timing circuit 74. Simultaneously, a conventional counter 76, which functions as a divide by N circuit to transform the count to a frequency is clocked by the timing unit and the output of counter 76 and counter 72 are applied to a conventional dividing circuit 78 the output of which is a number corresponding to the frequency of the modulation of the probe beam. The output of divide circuit 78 is applied to a conventional telemetry transmitter 80 which is also supplied with position information from a conventional position indicating system generally indicated by block 82. This system may merely be one in which an identifying code is multiplexed into the signal transmitted by the buoy. Since the position of the buoy is known, the signal from this buoy may be correlated with position. A power supply 84, which may be any of a number of portable power supplied such as conventional batteries, seawater batteries, etc., is applied to power all activate electronic equipment within dotted box 86.

The signal from the buoy is transmitted to receiving antenna 88 coupled to a receiver 90 which may be on an overflying aircraft. The receiver de-multiplexes the telemetry data and produces a signal indicative of the frequency of the Larmor precession. This signal is coupled to a unit 92 which performs a df/dt function, thereby to detect the change in magnetic fields due to moving subsurface anomalies such as submarines, or surface ships. As the anomaly producing device moves past the buoy its velocity translates into a change in the local magnetic field, and it is this change which is monitored by the system of FIG. 5. Assuming a change in the local magnetic field indicative of either the passage of a submarine or surface ship an alarm 94 may be activated.

Simultaneous with the transmission of the frequency read out from the magnetometer, a signal indicative of the position of the buoy may be read out from receiver 90 and may be applied to a position demultiplexing circuit 96 which in turn drives a display 98, such that the presence of a moving anomaly producing device is displayed coincidentally with the position of the particular buoy at which the moving anomaly occurs.

It will be appreciated that by differentiating the signal indicative of the Larmor frequency with respect to time, the static geomagnetic fields, such as those produced naturally, will be eliminated and that only fields which vary with time will be detected. Not only will this system detect the movement of ships past the buoy, but also low frequency variations in the magnetic field due to apparatus aboard these ships can also be detected by the subject invention.

Figure 6:
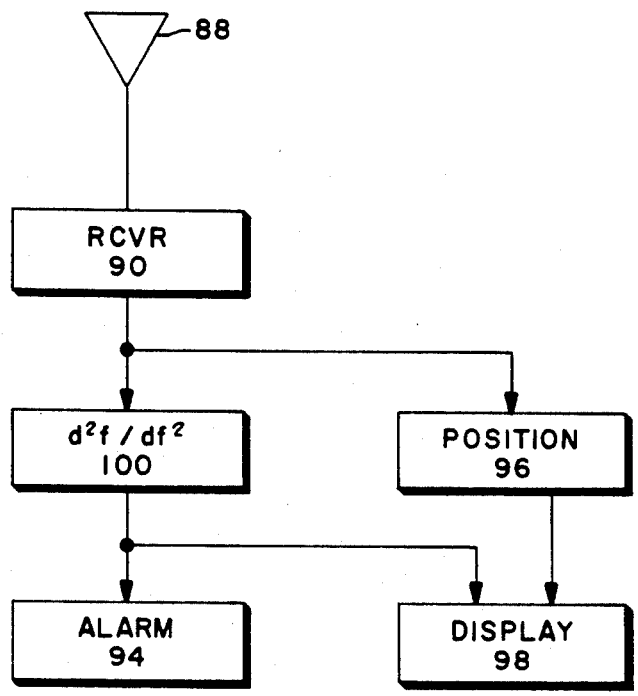
FIG. 6 is a schematic diagram illustrating the double differentiation of the magnetometry signal for eliminating background noise.

Referring now to FIG. 6, at the receiving end, a double differentiation may be substituted for the single differentiation illustrated in FIG. 5. In FIG. 6 the double differentiation takes place at unit 100.

It will be appreciated that the double differentiation may be utilized to detect accelerations of subsurface or surface vessels while at the same time more thoroughly discriminating against static background noise caused by more slowly varying magnetic fields.

Figure 7:
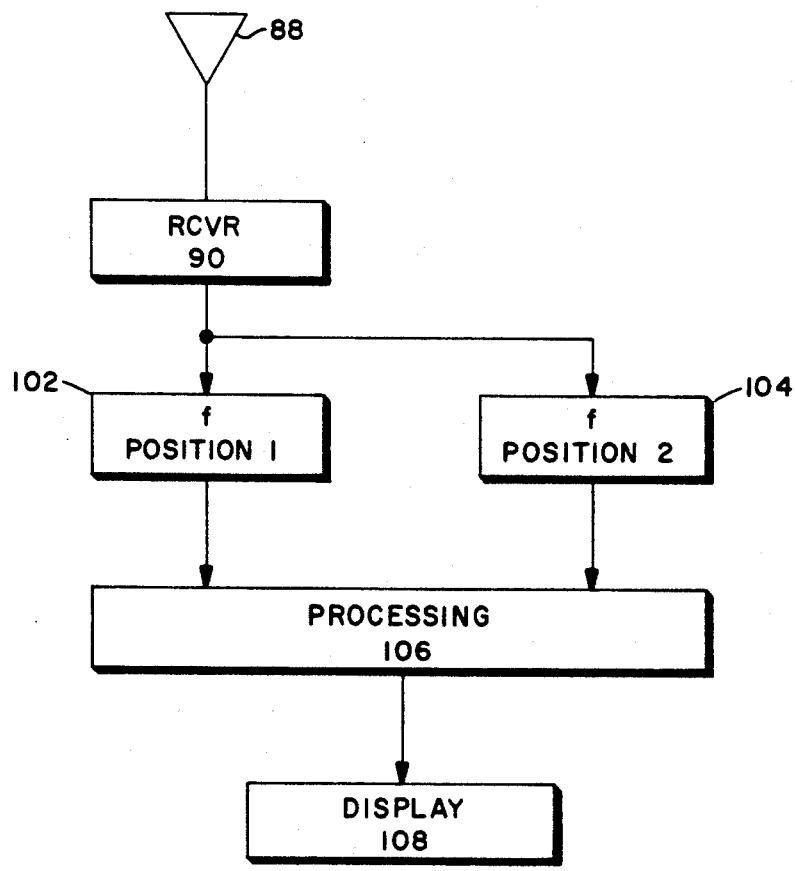
FIG. 7 is a schematic diagram illustrating the detection of magnetic fields from two different adjacent locations so as to detect the DRT of a moving magnetic anomaly producing body.

Referring to FIG. 7 the receiving unit may be provided with apparatus for determining the local magnetic field at a first position and the local magnetic field at a second position. This permits adjacent buoys to be utilized to indicate the passage and also the direction of a subsurface or surface vessel. Units for accomplishing this are illustrated at 102 and 104. Once deriving the frequency and thus the magnetic field at one position and the frequency and thus the magnetic field at another position adjacent the first position, conventional signal processing can provide a signal which indicates the location and direction of progress of the subsurface or surface vessel. This is accomplished conventionally by a processing unit 106 and a display unit 108, such that a dead reckoning track (DRT) may be displayed at a console on an overflying aircraft.

Figure 8:
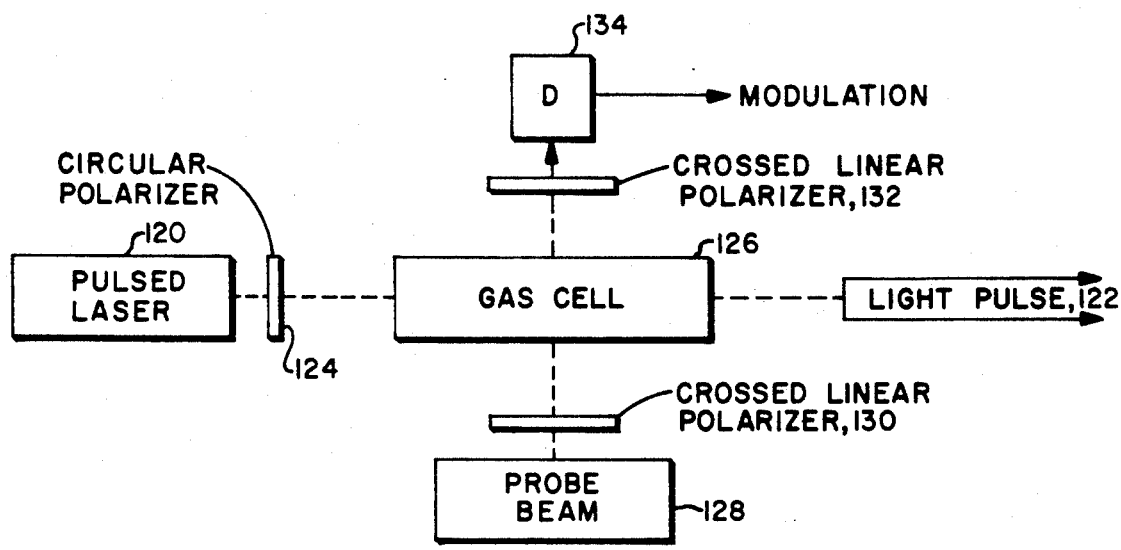
FIG. 8 is a block diagram illustrating the use of crossed polarizers for increasing the signal-to-noise ratio of the subject system.

Referring now to FIG. 8, an embodiment of the subject invention utilizing crossed polarizers is illustrated. In this embodiment, as in the previous case, a pulsed laser 120 transmits a light pulse 122 through a circular polarizer 124 and a gas cell 126. A probe beam generated at 128 passes through a first polarizer 130, through the gas cell, through a second polarizer 132 crossed with respect to the first polarizer, and then to a detector 134. Laser 120 is tuned to a predetermined transition of the gas in gas cell 126, while the probe beam frequency may be removed from this absorption transition frequency to preclude depumping of the gas by the probe beam.

Figure 9A:
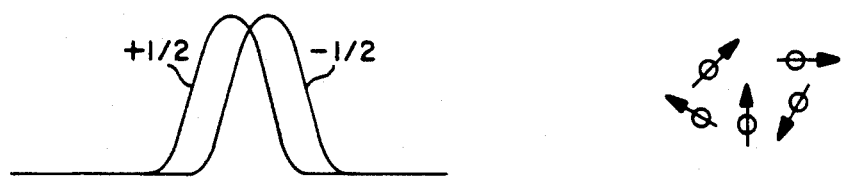
FIGS. 9A and 9B show various angular momentum vectors.

In general, as illustrated in FIG. 9A, prior to the passage of the pumping pulse, the angular momentum vectors exhibit a random orientation and the gas is not polarized. Thus, it is not possible to resolve the $+\frac{1}{2}$, $-\frac{1}{2}$ absorption spectra. After pumping (FIG. 9B), with the alignment of the angular momentum vectors, the gas is polarized, with attenuation coefficients shifting as shown at the Larmor precession frequency such that maximum attenuation of LHCP and RHCP components alternates. This shift is easily detected by the crossed polarizers and the magnitude of the local magnetic field is easily resolved in terms of the modulation frequency.

More specifically, the cross polarizer embodiment employs the Faraday effect to enhance the signal-to-noise ratio. The way in which this is accomplished is now described. First, considering the Faraday effect, a linearly polarized beam of light may be written as the sum of a lefthand circularly polarized and righthand circularly polarized beam. This may be illustrated as follows. Considering an electric vector oscillating along a y axis:

$$\vec{E}(t) = \hat{j}E_o \sin \omega t$$

where j is a unit vector along the y axis. Then manipulating this equation, $$\vec{E}(t) = \hat{j}E_o\sin\omega t = \hat{j}\frac{E_o}{2}\sin\omega t + \hat{j}\frac{E_o}{2}\sin\omega t$$

$$= \hat{j}\frac{E_o}{2}\sin\omega t + \hat{j}\frac{E_o}{2}\sin\omega t + \hat{i}\frac{E_o}{2}\cos\omega t - \hat{i}\frac{E_o}{2}\cos\omega t$$

$$= \frac{E_o}{2}(\hat{j}\sin\omega t + \hat{i}\cos\omega t) + \frac{E_o}{2}(\hat{j}\sin\omega t - \hat{i}\cos\omega t)$$

Here î is a unit vector along the x axis.

As can be seen, the original electric vector has been expressed as the sum of an electric vector rotating in the counterclockwise direction and one rotating in the clockwise direction.

When a linear polarized wave passes through a birefringent medium the righthand circularly polarized component propagates at a different velocity from that of the lefthand circularly polarized component. As a result, the two components get out of phase. The electric vector at some point after propagating through the vapor may then be expressed by:

$$\vec{E}(t) = \frac{E_o}{2}(\hat{j}\sin\omega t + \hat{i}\cos\omega t) +$$

$$\frac{E_o}{2}(\hat{j}\sin(\omega t + \phi) - \hat{i}\cos(\omega t + \phi))$$

where $\phi$ is the phase difference induced between the right and lefthand circularly polarized components by their different propagation velocities through the vapor or gas.

This last equation represents a linearly polarized wave rotated by an angle of $(\phi/2)$ relative to its previous orientation.

Figure 9B:
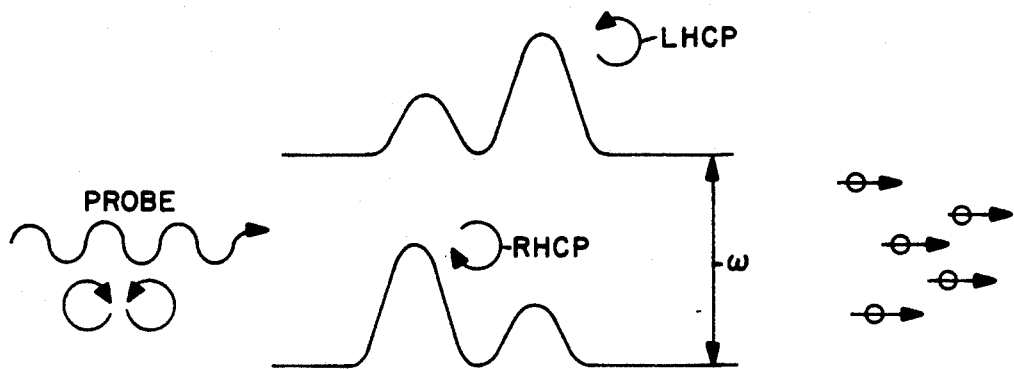

The way in which the apparatus of FIG. 8 operates is now described. The polarizer in front of the probe beam source, polarizer 130, linearly polarizes the probe beam, which then falls on the gas cell. The polarized gas in the cell, which has been polarized in the usual way by a burst of light from the pulsed laser 120, constitutes a birefringent medium whose optical properties vary periodically at the Larmor precession frequency as the polarized atomic gas or vapor precesses (FIG. 9B). Specifically, if the vapor is polarized along the direction of propagation of the probe beam, then one of the two circularly polarized components which make up the probe beam will propagate more rapidly than the other. As previously discussed, when this occurs the axis of polarization will be rotated by the angle $\phi/2$. If the atomic vapor is polarized anti-parallel to the direction of propagation of the probe beam, then the probe beam polarization will be rotated by an angle $-\phi/2$. The direction of polarization of the probe beam thus oscillates back and forth between $-\phi/2$ and $\phi/2$ as the atomic vapor precesses.

The polarized light beam then impinges on polarizer 132, which passes only that component of the light beam which is polarized perpendicular to the original polarization direction. The magnitude of this component varies periodically as the direction of the axis of polarization of the light changes. Consequently, the intensity of the light beam on the far side of the second polarizer, polarizer 132, is modulated in time. In this particular embodiment, the modulation is at twice the Larmor frequency, since as much light passes the polarizer for a probe beam rotation of $-\phi/2$ as for a rotation of $\phi/2$. If the second polarizer is rotated slightly so that relative to its axis of polarization the probe beam polarization varies between $\alpha$ and $\alpha + \phi$, then the intensity on the far side of the polarizer is modulated at the Larmor frequency.

One of the advantages of the utilization of cross polarization and the Faraday effect is that the light employed in the probe beam is "off resonant". This means that it lies outside the profile of the absorption line. Consequently, the vapor does not absorb energy from the probe beam, and because of this the probe beam does not tend to de-pump or depopulate the vapor.

Secondly, when there is no Faraday rotation, no light reaches the detector because the polarizers are crossed at 90°. Thus, unlike the embodiment in which absorption is employed, there is no average light intensity arriving at the detector which light intensity is independent of the signal amplitude, and which contributes to the noise and not to the signal. Consequently, with the crossed polarizer detection system, a considerable decrease in noise level is achieved. Moreover, improvements in the more significant quantity, the signal-to-noise ratio are also achieved.

Thus, what has been provided is a magnetometer which is suitable for deployment in buoys which are low power and which offer significant sensitivity to local magnetic fields. In general, this is accomplished by a method and apparatus for detecting magnetic field strength in which a volume of gas having unpaired electrons is provided, with the atoms being pumped at a predetermined transition of the gas so as to align the magnetic moments of the atoms of the gas in a single direction and so as to cause unreinforced free precession of the magnetic moments of the atoms about the local magnetic field vector. The frequency of the unreinforced free precession is then obtained, with the strength of the local magnetic field being proportional to the free precession frequency. In the water-born, battery-operated embodiment, means are also provided for transmitting a signal indicative of the free precession frequency to a remote location where it is received.

Although preferred embodiments of the invention have been described in considerable detail for illustrative purposes, many modifications will occur to those skilled in the art. It is therefore desired that the protection afforded by Letters Patent be limited only by the true scope of the appended claims.

I claim:

1. A magnetometer comprising,
   a cell of gas having unpaired electrons,
   means for transmitting a non-continuous pulse of energy through the cell at a frequency corresponding to a transition of the gas, and,
   means for obtaining the frequency of the resulting unreinforced free precession of the aligned angular moments of the atoms of the gas about the local magnetic field at said gas cell after the passage of said pulse through said cell, said frequency being proportional to the local magnetic field at said gas cell.

2. The magnetometer of claim 1 wherein said frequency obtaining means includes a probe beam passing through said cell, and means for detecting the intensity of said probe beam.

3. The magnetometer of claim 2 wherein said pulse of energy is circularly polarized.

4. The magnetometer of claim 3 wherein said probe beam is circularly polarized.

5. The magnetometer of claim 2 and further including first linear polarizing means for polarizing said probe beam prior to passage through said cell and second linear polarizing means, cross polarized with respect to said first linear polarizing means, in the path of said probe beam between said cell and said detecting means.

6. The magnetometer of claim 2 wherein said energy transmitting means includes a pulsed laser.

7. The magnetometer of claim 2 wherein the frequency of said probe beam corresponds to said first mentioned transition of said gas.

8. The magnetometer of claim 2 wherein the frequency of said probe beam is different from that of said pulse of energy.

9. The magnetometer of claim 2 wherein said first mentioned transition is from an S state to a P state of the gas.

10. The magnetometer of claim 1 wherein said gas is taken from the group consisting of the alkali metals and metastable hydrogen.

11. The magnetometer of claim 2 wherein said probe beam is continuous.

12. The magnetometer of claim 2 wherein said gas contains cesium atoms.

13. The magnetometer of claim 1 and further including means for differentiating the frequency obtained at said frequency obtaining means with respect to time.

14. The magnetometer of claim 1 and further including means for double differentiating the frequency obtained at said frequency obtaining means with respect to time.

15. A method of detecting magnetic field strength comprising the steps of:
    providing a volume of gas having atoms with unpaired electrons,
    pumping the atoms with a non-continuous pulse of energy at a predetermined transition of said atoms so as to align the magnetic moments of the atoms of said gas in a single direction, and so as to cause unreinforced free precession of the magnetic moments of said atoms about the local magnetic field vector, and,
    obtaining the frequency of said unreinforced free precession, the strength of said local magnetic field being proportional to said frequency.

16. The method of claim 15 wherein said frequency obtaining step includes the step of passing a probe beam through said gas volume and measuring the frequency of the intensity modulation of said probe beam.

17. A system for detecting the presence of ocean going vessels comprising;
    a water-born buoy including a battery-operated magnetometer including a cell of gas having unpaired electrons, means for transmitting a non-continuous pulse of energy through the cell at a frequency corresponding to a transition of the gas, means for obtaining the frequency of the resulting unreinforced free precession of the aligned angular moments of the atoms of the gas about the local magnetic field at said gas cell after the passage of said pulse through said cell, said frequency being proportional to the local magnetic field at said gas cell and means for transmitting a signal indicative of said frequency to a location remote from said buoy, and
    means at said remote location for receiving said transmitted signal.

18. The system of claim 17 wherein said frequency obtaining means includes a probe beam passing through said cell, and means for detecting the intensity of said probe beam.

19. The system of claim 18 wherein said pulse of energy is circularly polarized.

20. The system of claim 19 wherein said probe beam is circularly polarized.

21. The system of claim 18 and further including first linear polarizing means for polarizing said probe beam prior to passage through said cell and second linear polarizing means, cross polarized with respect to said first linear polarizing means, in the path of said probe beam between said cell and said detecting means.

22. The system of claim 18 wherein said energy transmitting means includes a pulsed laser.

23. The system of claim 18 wherein the frequency of said probe beam corresponds to said first mentioned transition of said gas.

24. The system of claim 18 wherein the frequency of said probe beam is different from that of said pulse of energy.

25. The system of claim 18 wherein said first mentioned transition is from an S state to a P state of the gas.

26. The system of claim 17 wherein said gas is taken from the group consisting of the alkali metals and metastable hydrogen.

27. The system of claim 18 wherein said probe beam is continuous.

28. The system of claim 18 wherein said gas contains cesium atoms.

29. The system of claim 17 wherein said receiving means includes differentiating the frequency obtained at said frequency obtaining means with respect to time.

30. The system of claim 29 and further including alarm means activated in response to the output from said differentiating means.

31. The system of claim 17 wherein said receiving means includes means for double differentiating the frequency obtained at said frequency obtaining means with respect to time.

32. The system of claim 31 and further including alarm means activated in response to the output from said double differentiating means.

* * * * *